(12) United States Patent
Decker et al.

(10) Patent No.: US 7,437,590 B2
(45) Date of Patent: Oct. 14, 2008

(54) SPREAD-SPECTRUM CLOCKING

(75) Inventors: Steven Decker, Sandown, NH (US); Jianrong Chen, Andover, MA (US); David P. Foley, Chelmsford, MA (US); Mark T. Sayuk, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 77 days.

(21) Appl. No.: 11/404,495

(22) Filed: Apr. 14, 2006

(65) Prior Publication Data
US 2007/0194817 A1 Aug. 23, 2007

Related U.S. Application Data

(60) Provisional application No. 60/775,486, filed on Feb. 22, 2006.

(51) Int. Cl.
*G06F 1/00* (2006.01)
*G06F 1/04* (2006.01)
*G06F 1/06* (2006.01)
*G06F 1/08* (2006.01)

(52) U.S. Cl. ............... 713/500; 713/501; 713/502; 713/503

(58) Field of Classification Search ............ 713/500, 713/501, 502, 503
See application file for complete search history.

(56) References Cited

U.S. PATENT DOCUMENTS

| | | | |
|---|---|---|---|
| 5,488,627 A | 1/1996 | Hardin et al. | |
| 5,631,920 A | 5/1997 | Hardin | |
| 5,867,524 A | 2/1999 | Booth et al. | |
| 5,872,807 A | 2/1999 | Booth et al. | |
| 6,031,401 A | 2/2000 | Dasgupta | |
| 6,157,694 A * | 12/2000 | Larsson | 377/48 |
| 6,167,103 A | 12/2000 | Hardin | |
| 6,292,507 B1 | 9/2001 | Hardin et al. | |
| 6,366,174 B1 | 4/2002 | Berry et al. | |
| 6,597,226 B1 | 7/2003 | Eade et al. | |
| 6,600,355 B1 * | 7/2003 | Nguyen | 327/298 |
| 6,643,317 B1 | 11/2003 | Blumer | |

(Continued)

FOREIGN PATENT DOCUMENTS

EP 1 505 732 AA 2/2005

OTHER PUBLICATIONS

Damphousse, S., et al. "All Digital Spread Spectrum Clock Generator for EMI Reduction," *IEEE Journal of Solid-State Circuits*, vol. 42, No. 1, Jan. 2007, pp. 145-150.

(Continued)

*Primary Examiner*—Thomas Lee
*Assistant Examiner*—Ji H. Bae
(74) *Attorney, Agent, or Firm*—Wolf, Greenfield & Sacks, P.C.

(57) ABSTRACT

A state machine circuit may be used to control a multiplexing circuit that selects and provides respective ones of multiple input clock signals to a clock-synthesizing circuit that generates a synthesized clock signal in response to such input clock signals. The state machine circuit may, for example, be configured so that the synthesized clock signal is a spread-spectrum clock signal and/or a clock signal having a nominal frequency that is greater than a nominal frequency of each of the input clock signals.

31 Claims, 13 Drawing Sheets

U.S. PATENT DOCUMENTS

| | | |
|---|---|---|
| 6,658,043 B2 | 12/2003 | Hardin et al. |
| 6,690,219 B2 | 2/2004 | Chuang |
| 6,904,112 B1 | 6/2005 | Sattler et al. |
| 6,909,311 B2 | 6/2005 | Foley et al. |
| 6,933,761 B2* | 8/2005 | Chang .................. 327/231 |
| 7,010,014 B1* | 3/2006 | Percey et al. .............. 375/130 |
| 2003/0042954 A1 | 3/2003 | Chuang |
| 2005/0063503 A1* | 3/2005 | Nandy .................. 375/371 |
| 2005/0185731 A1 | 8/2005 | Hardin et al. |
| 2006/0077275 A1 | 4/2006 | Pan et al. |
| 2007/0063755 A1* | 3/2007 | Gilliland .................. 327/291 |

OTHER PUBLICATIONS

Davis, Paul C. et al., A Fully Integrated Timing Generator for the Picture-Phone Video-Telephone Camera, IEEE J. Solid-State Circuits, vol. 4, No. 5, pp. 259-263, Oct. 1969.

Liming, X. et al. "A Flying-Adder Architecture of Frequency and Phase Synthesis with Scalability" *IEEE Transactions on Very Large Scale Integration Systems*, vol. 10, No. 5, Oct. 2002, pp. 637-649.

* cited by examiner

SPREAD-SPECTRUM CLOCKING

CROSS REFERENCE TO RELATED APPLICATIONS

This application claims the benefit of U.S. Provisional Application Ser. No. 60/775,486, entitled "SPREAD-SPECTRUM CLOCKING," filed on Feb. 22, 2006, which is incorporated herein by reference in its entirety.

BACKGROUND

Spread-spectrum clocking is a technique used to reduce the radiated emissions (also known as EMI (Electromagnetic Interference) or RFI (Radio Frequency Interference)) from clocked systems such as microprocessors or I/O links. The concept is shown in FIGS. 1 and 2. $F_{clk}$, the nominal clock frequency, is the average rate at which data can be processed or transmitted. The EMI spectrum from a system employing a fixed-rate clock is roughly approximated by the sharp peaks centered at multiples of $F_{clk}$ in FIG. 2. When the clock frequency is varied over time as shown in FIG. 1, the peaks in FIG. 2 tend to spread out. Although the total energy in each harmonic is unchanged, the peaks are reduced because the energy is spread out over a wider range of frequencies. FIG. 1 shows frequency vs. time for the common choice of triangle-wave modulation.

FIG. 3 shows an example of a prior art spread-spectrum clock generation circuit 300. As shown, the circuit 300 employs a phase frequency detector (PFD) 302, a charge pump 304, a loop filter 306, an adder 308, a voltage-controlled oscillator (VCO) 310, and a feedback divider 312. Without the adder 308, the circuit 300 corresponds to a conventional charge-pump phase-locked loop (PLL). The feedback divider 312 forces the output clock frequency to an integer multiple of the reference clock frequency. The PFD 302 compares the phases of the reference clock and the output of the feedback divider, and outputs a signal proportional to the difference. If the phase of the output of the feedback divider 312 lags the phase of the reference clock, voltage pulses indicative of the phase difference are output from the PFD 302 on a first output 314a. Conversely, if the phase of the output of the feedback divider 312 leads the phase of the reference clock signal, voltage pulses indicative of the phase difference are output from the PFD 302 on a second output 314b. The first and second outputs 314 are coupled to the charge pump 304, which converts the voltage pulses from the PFD 302 into current pulses. The current pulses generated by the charge pump 304 are, in turn, integrated by the loop filter 306. A modulating signal 316 added at the input of the VCO 310 causes the output clock frequency to vary over time with the same period as the modulating signal.

The amplitude and shape of the output clock frequency profile approximately follows the modulating signal, but is subject to several non-idealities. First, the constant of proportionality between the modulating (voltage) signal and the output clock frequency is determined by the VCO gain $K_{vco}$, which is subject to process, supply voltage, and temperature (PVT) variation. Second, the feedback loop attenuates frequency components of the modulating signal within the PLL loop bandwidth. VCO noise suppression or settling time requirements often make it impractical to limit the PLL bandwidth enough to avoid significant distortion of the modulating signal. Pre-emphasis of the modulating signal can reduce this effect, but is difficult to implement and can never provide perfect cancellation due to PVT variation and device mismatch.

PLL-based spread-spectrum clock generation also suffers from other limitations. For example, it is difficult to program modulation parameters or change the basic modulation shape of an analog waveform. Automated testing of a spread-spectrum clock generated by such a system is also difficult because it requires detection and processing of a large number of closely-spaced clock edges.

One technique for digital clock synthesis is disclosed in U.S. Pat. No. 6,909,311 ("the '311 patent"), issued Jun. 21, 2005 and entitled "Method and apparatus for synthesizing a clock signal," which is incorporated herein by reference in its entirety. One of the digital clock synthesis circuits disclosed in the '311 patent is shown in FIG. 4 herein. As shown, the circuit 400 comprises a clock generating circuit 402, a multiplexing circuit 404, and a clock synthesizing circuit 406. The clock generating circuit 402 comprises a delay-locked loop (DLL) that generates sixty-four delayed versions of a reference clock, the multiplexing circuit 404 comprises two 64-to-1 multiplexers 405a, 405b, and the clock synthesizing circuit 406 comprises a 2-to-1 multiplexer 408 and a flip-flop 410.

FIG. 5 is a graph illustrating clock phases output from the DLL of FIG. 4. As shown, the delayed clocks output by the DLL may be evenly spaced in time, so that the difference in delay between DLL[i] and DLL[i+1] is one sixty-fourth of the reference clock period.

Assuming the synthesized clock is initially low, the 2-to-1 multiplexer 408 selects the output of the "R" multiplexer 405a. A rising edge of the clock selected by the "R" multiplexer 405a causes the flip-flop 410 to toggle and the 2-to-1 multiplexer 408 now selects the output of the "F" multiplexer 405b. A rising edge on the clock selected by the "F" multiplexer 405b causes the flip-flop 410 to toggle again, returning to the initial state. This method allows the synthesis of a clock with arbitrary (within one sixty-fourth of the reference clock period) placement of the rising and falling edge, as determined by the selected taps of the multiplexers 405a-b. FIG. 6 shows the circuit of FIG. 4 along with resulting waveforms at particular nodes when the rising edge location is set to tap "8" and the falling edge location is set to tap "28."

SUMMARY OF THE INVENTION

According to one aspect of the present invention, a method comprises steps of receiving a plurality of clock signals; providing selected ones of the plurality of clock signals to a clock synthesizing circuit; using the clock synthesizing circuit to generate a synthesized clock signal having transitions determined by transitions of the selected ones of the plurality of clock signals; and controlling selection of the ones of the plurality of clock signals that are provided to the clock synthesizing circuit so that the clock synthesizing circuit generates a spread-spectrum clock signal.

According to another aspect of the invention, an apparatus comprises a clock generating circuit, a multiplexing circuit, a clock synthesizing circuit, and a state machine circuit. The clock generating circuit is configured to generate a plurality of clock signals. The multiplexing circuit comprises a plurality of clock inputs coupled to the clock generating circuit to receive the plurality of clock signals therefrom, at least one control input, and at least one output, and is configured to select particular ones of the plurality of clock signals to be provided at the at least one output based upon a state of at least one control signal received at the at least one control input. The clock synthesizing circuit is coupled to the at least one output of the multiplexing circuit to receive the selected ones of the plurality of clock signals therefrom, and is configured to output a synthesized clock signal having transitions determined by transitions of the selected ones of the plurality of clock signals. The state machine circuit is coupled to the multiplexing circuit to provide the at least one control signal thereto, and is configured to alter the state of the at least one control signal so as to cause the multiplexing circuit to select the particular ones of the plurality of clock signals that are provided at the at least one output so that the clock synthesizing circuit generates the synthesized clock signal as a spread-spectrum clock signal.

According to another aspect of the invention, a method comprises steps of receiving a plurality of clock signals, each oscillating at a nominal frequency that is less than a particular value; providing selected ones of the plurality of clock signals to a clock synthesizing circuit; using the clock synthesizing circuit to generate a synthesized clock signal having transitions determined by transitions of the selected ones of the plurality of clock signals; and controlling selection of the ones of the plurality of clock signals that are provided to the clock synthesizing circuit so that the clock synthesizing circuit generates a synthesized clock signal that oscillates at a nominal frequency that is greater than the particular value.

According to another aspect of the invention, an apparatus comprises a clock generating circuit, a multiplexing circuit, a clock synthesizing circuit, and a state machine circuit. The clock generating circuit is configured to generate a plurality of clock signals, each oscillating at a nominal frequency that is less than a particular value. The multiplexing circuit comprises a plurality of clock inputs coupled to the clock generating circuit to receive the plurality of clock signals therefrom, at least one control input, and at least one output, and is configured to select particular ones of the plurality of clock signals to be provided at the at least one output based upon a state of at least one control signal received at the at least one control input. The clock synthesizing circuit is coupled to the at least one output of the multiplexing circuit to receive the selected ones of the plurality of clock signals therefrom, and is configured to output a synthesized clock signal having transitions determined by transitions of the selected ones of the plurality of clock signals. The state machine circuit is coupled to the multiplexing circuit to provide the at least one control signal thereto, and is configured to alter the state of the at least one control signal so as to cause the multiplexing circuit to select the particular ones of the plurality of clock signals that are provided at the at least one output so that the clock synthesizing circuit causes the synthesized clock signal to oscillate at a nominal frequency that is greater than the particular value.

According to another aspect of the invention, a method comprises steps of receiving at least three clock signals; selecting respective ones of the at least three clock signals to be provided to a clock synthesizing circuit based on a state of at least one control signal; using the clock synthesizing circuit to generate a synthesized clock signal having transitions determined by transitions of the selected ones of the at least three clock signals; and repeatedly cycling through at least three different states of the at least one control signal, in response to at least one clock signal, so as to cause at least three different ones of the at least three clock signals to be provided to the clock synthesizing circuit during each cycle of the at least three states.

According to another aspect of the invention, an apparatus comprises a clock generating circuit, a multiplexing circuit, a clock synthesizing circuit, and a state machine circuit. The clock generating circuit is configured to generate at least three clock signals. The multiplexing circuit comprises at least three clock inputs coupled to the clock generating circuit to receive the at least three clock signals therefrom, at least one control input, and at least one output, and is configured to select particular ones of the at least three clock signals to be provided at the at least one output based upon at least one control signal received at the at least one control input. The clock synthesizing circuit is coupled to the at least one output of the multiplexing circuit to receive the selected ones of the at least three clock signals therefrom, and is configured to output a synthesized clock signal having transitions determined by transitions of the selected ones of the at least three clock signals. The state machine circuit is coupled to the multiplexing circuit to provide the at least one control signal thereto, and is configured to repeatedly cycle through at least three different states of the at least one control signal, in response to at least one clock signal, so as to cause the multiplexing circuit to provide at least three different ones of the plurality of clock signals to the at least one output during each cycle of the state machine.

DETAILED DESCRIPTION OF PREFERRED EMBODIMENTS

Figure 1:
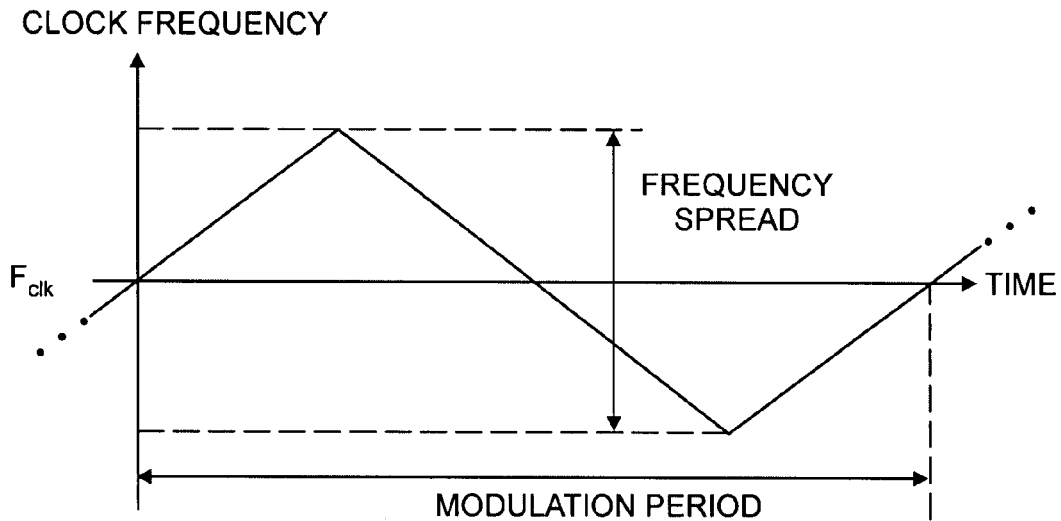
FIG. 1 is a graph illustrating how clock frequency can be varied as a function of time in connection with a prior art spread-spectrum clocking technique.
Figure 2:
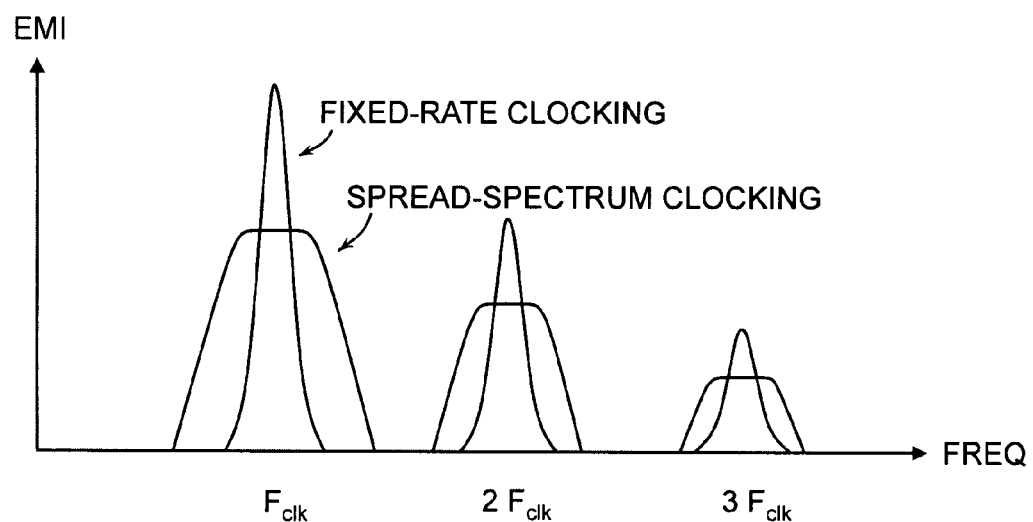
FIG. 2 is a graph illustrating how the use of spread-spectrum clocking, rather than fixed-rate clocking, can substantially reduce the EMI spectrum of a system.
Figure 3:
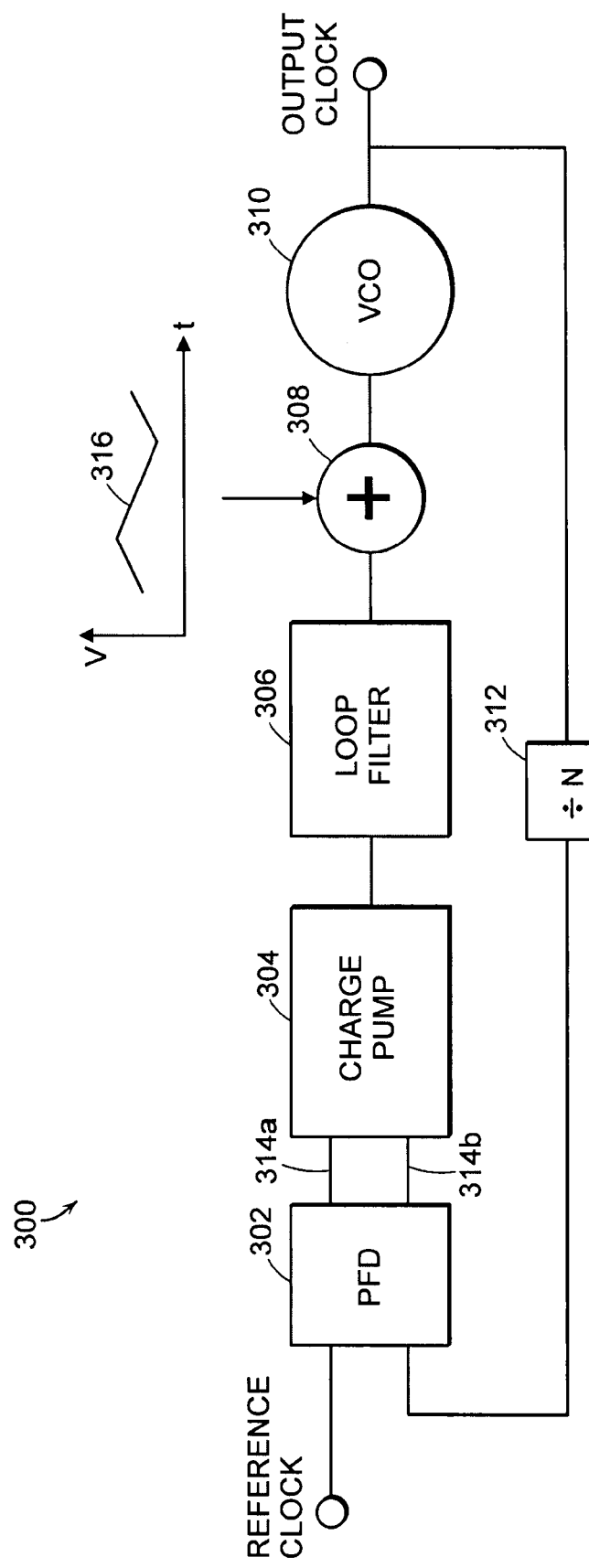
FIG. 3 is a block diagram of a prior art phase-locked loop-based spread-spectrum clock generation circuit.
Figure 4:
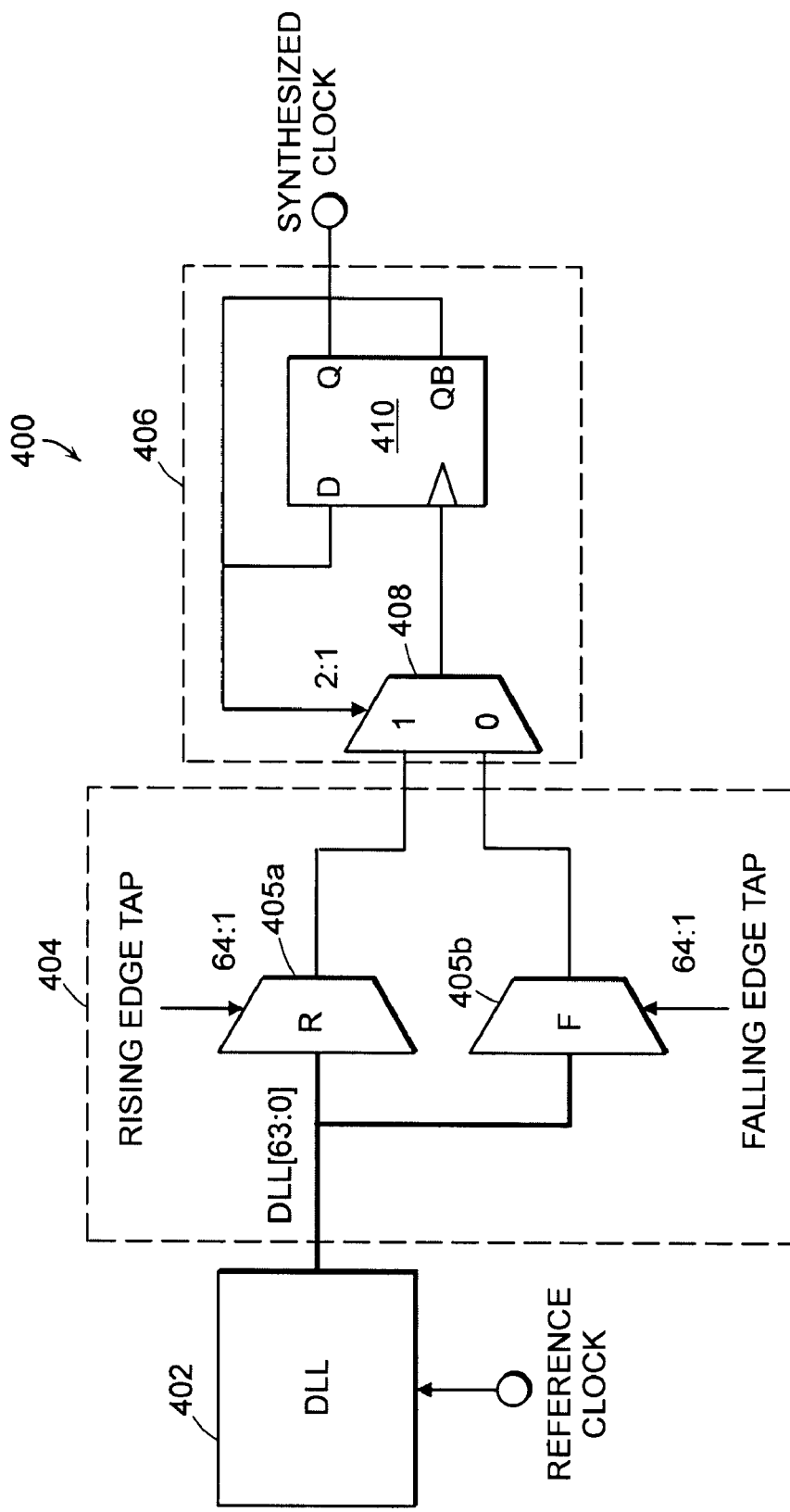
FIG. 4 is a block diagram of a prior art digital clock synthesis circuit.
Figure 5:
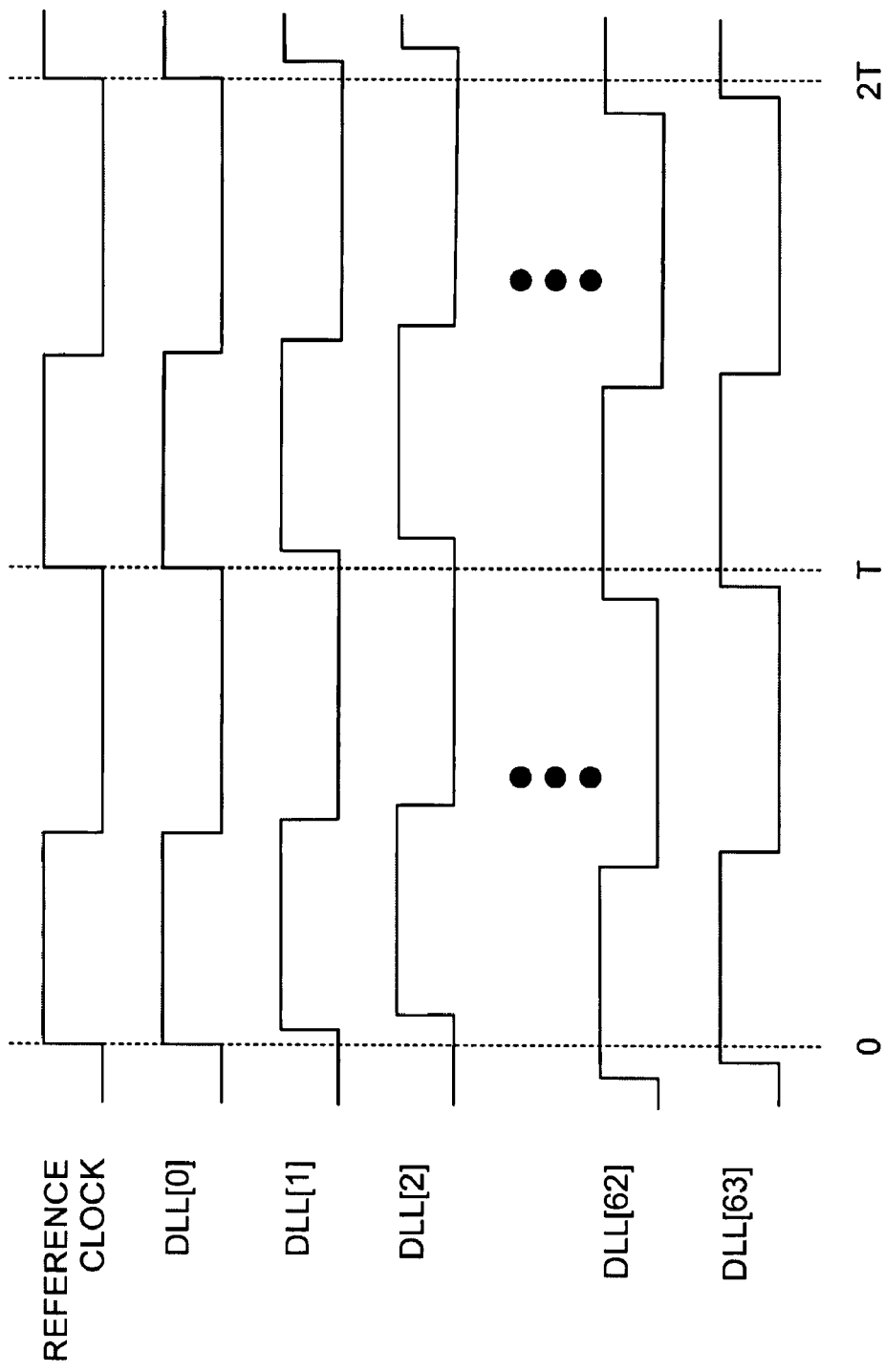
FIG. 5 is a graph illustrating clock phases output from the delay-locked loop shown in FIG. 4.
Figure 6:
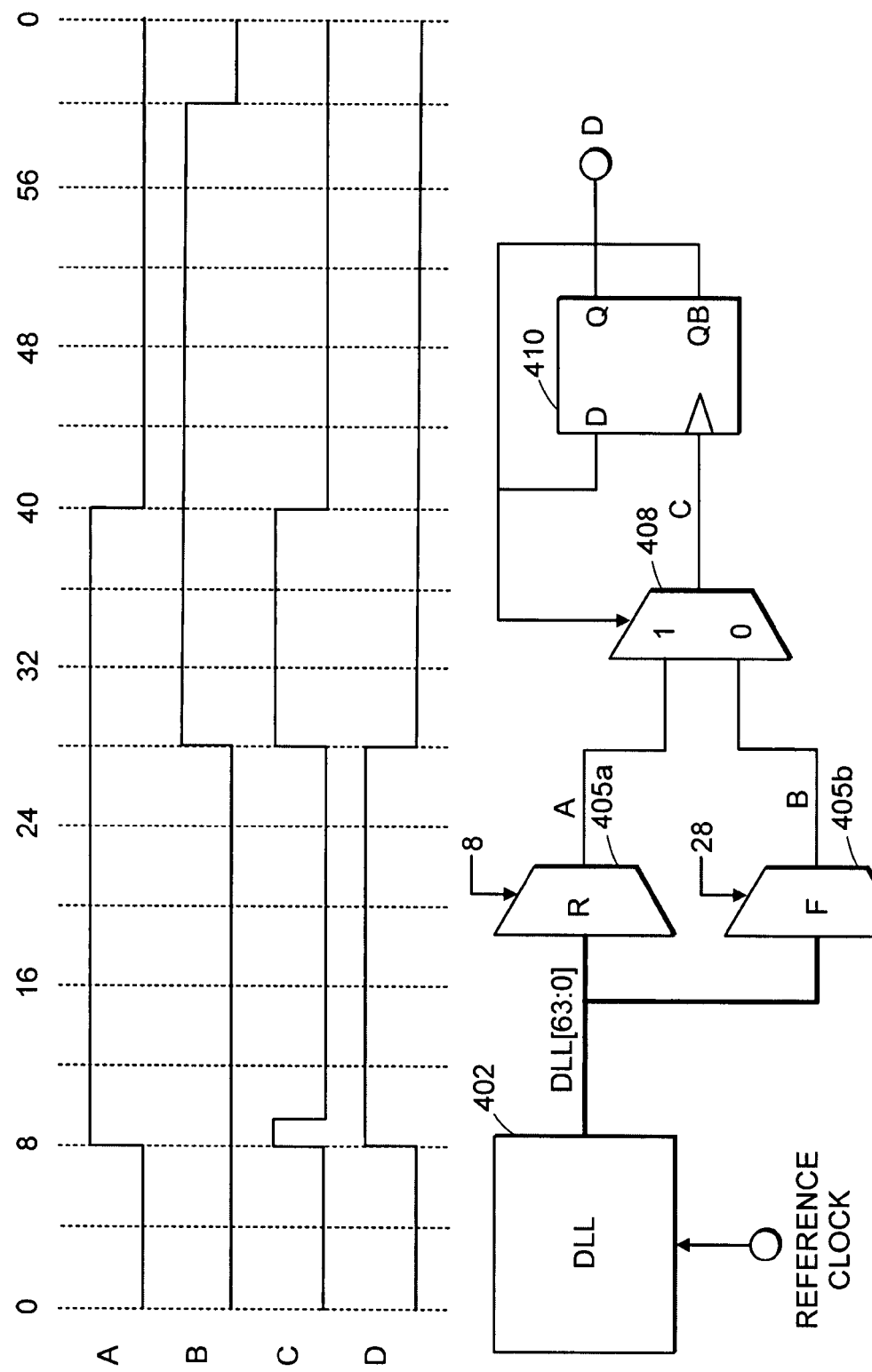
FIG. 6 is a block diagram and corresponding waveform diagram illustrating an example configuration, and resulting waveforms at particular nodes, of the prior art circuit shown in FIG. 4.
Figure 7:
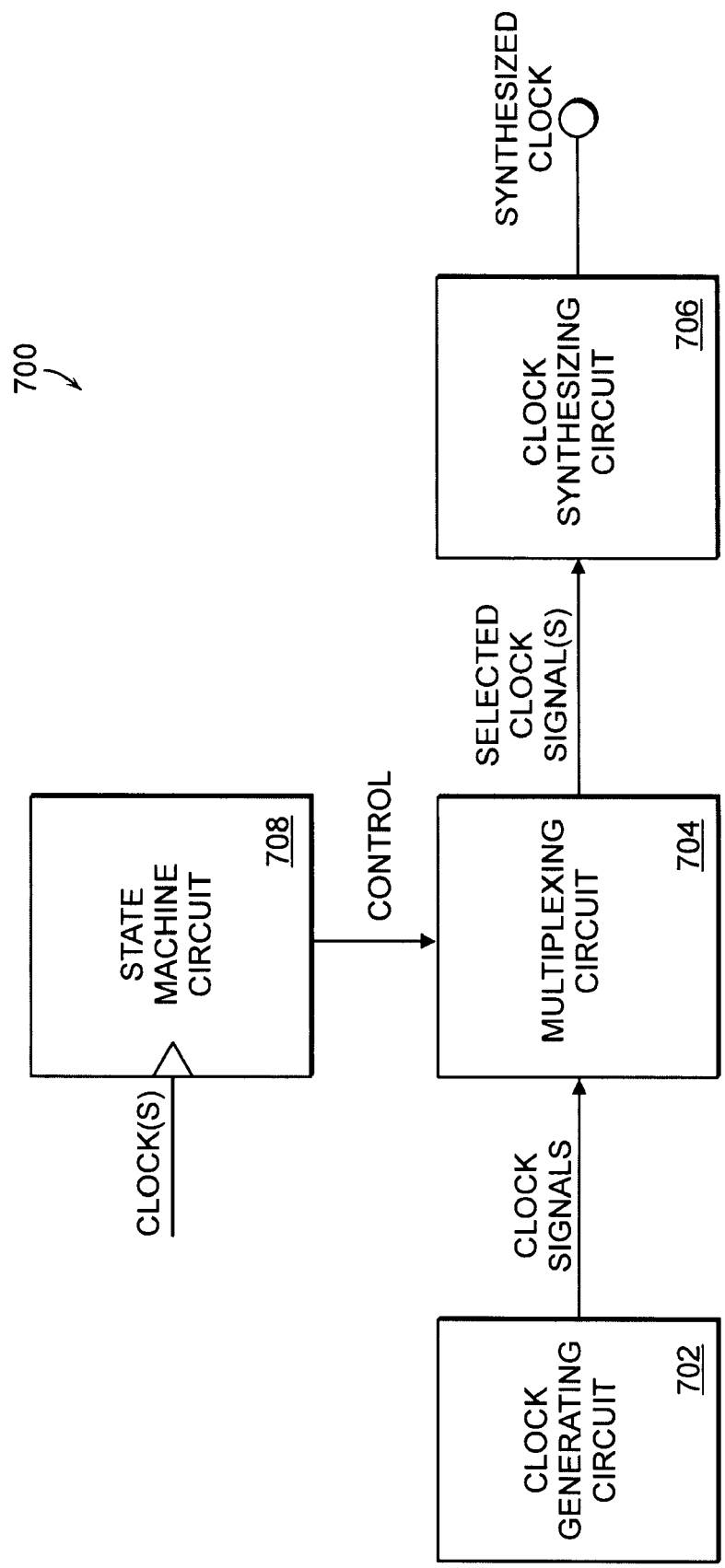
FIG. 7 is a block diagram of an illustrative embodiment of the invention.

The digital clock synthesis techniques disclosed in U.S. Pat. No. 6,909,311, incorporated by reference above, can be extended, for example, to produce a spread-spectrum clock and/or an output clock with a frequency higher than the reference clock. A block diagram of a circuit 700 capable of achieving such objectives is shown in FIG. 7. As shown, like the circuit of FIG. 4 (discussed above) and the other similar circuits disclosed in the '311 patent, the circuit 700 comprises a clock generating circuit 702, a multiplexing circuit 704, and a clock synthesizing circuit 706. Unlike such circuits, however, the circuit 700 advantageously employs a state machine circuit 708 that dynamically controls the selection of the clock signals that are output by the multiplexing circuit 704. It should be appreciated that any of the various circuits and/or techniques disclosed in the '311 patent for implementing the functionality of the clock generating circuit 702, the multiplexing circuit 704, and/or the clock synthesizing circuit 706 can be employed in various embodiments of the present invention.

Figure 8:
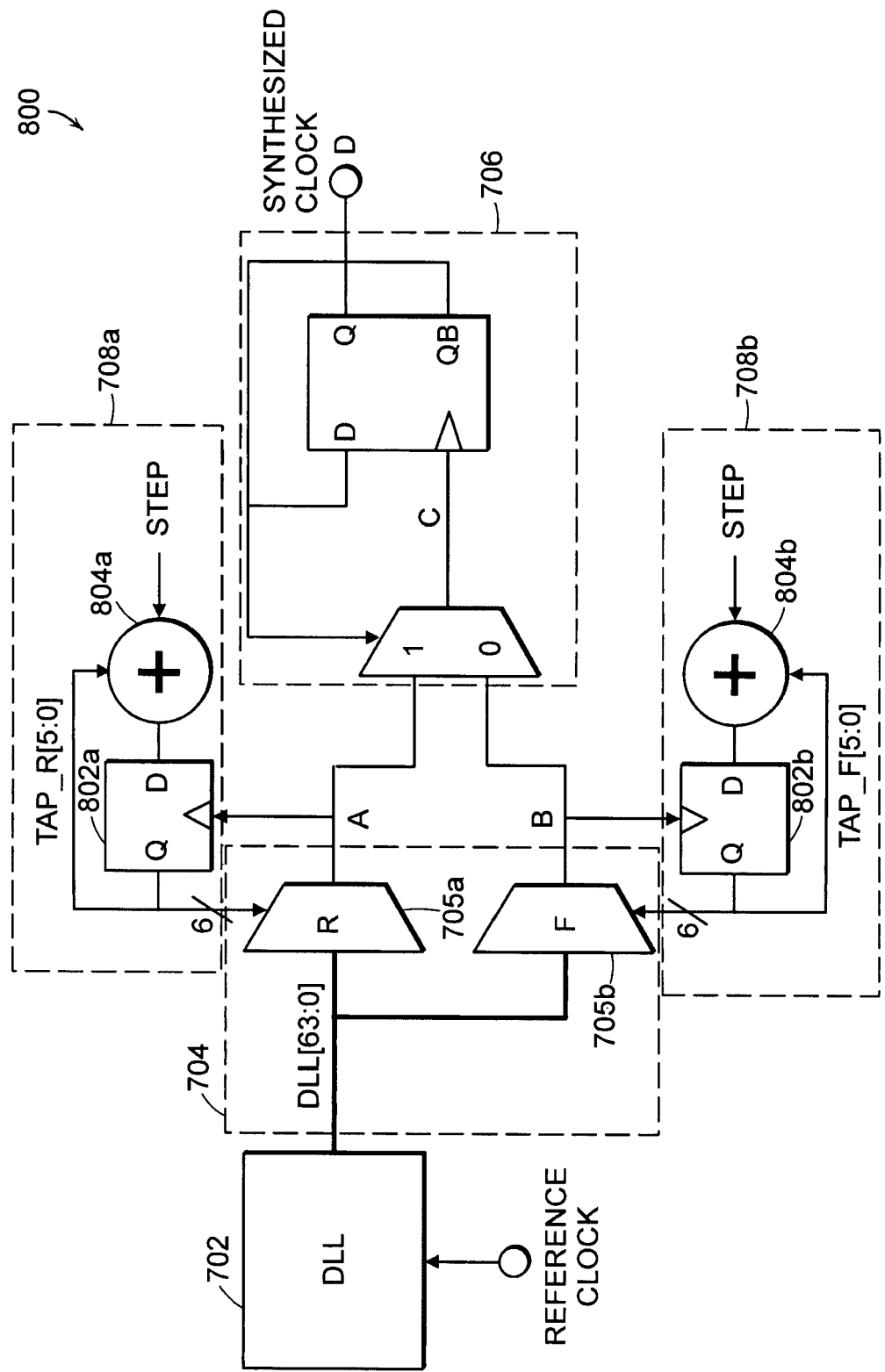
FIG. 8 is a block diagram of a delay-locked loop-based clock multiplier that embodies various aspects of the present invention.

In some embodiments, the state machine circuit 708 can be configured so that the circuit 700 generates a synthesized clock with a frequency higher than the reference clock. Such an implementation may be useful, for example, in systems requiring both precise timing control and reference clock multiplication. An example of a circuit 800 in which the state machine circuit 708 is configured to accomplish this result is shown in FIG. 8. As shown, the state machine circuit 708 may comprise two portions 708a, 708b, each providing a dynamically-changing, six-bit control signal to a respective one of the multiplexers 705a, 705b. In the example shown, the portion 708a of the state machine circuit 708 comprises a flip-flop 802a and an adder 804a, which together dynamically generate a six-bit control signal TAP_R for the multiplexer 705a, and the portion 708b of the state machine circuit 708 comprises a flip-flop 802b and an adder 804b, which together dynamically generate a six-bit control signal TAP_F for the multiplexer 705b. As shown, the flip-flops 802a and 802b may be clocked by the same clock signals that are selected by the multiplexers 705a and 705b, respectively, and provided to the clock synthesizing circuit 706. Thus, each such clock signal may cause the values of the control signals TAP_R and TAP_F to be incremented by the value to which the "STEP" parameter has been set. In some embodiments, the "STEP" parameter is programmable and thus can be adjusted for different applications or during different periods of use by the same application. The state machine circuit 708 of FIG. 8 can thus be used to dynamically generate rising and falling edge taps, so the synthesized clock can have multiple rising and falling edges in a single period of the reference clock.

Figure 9:
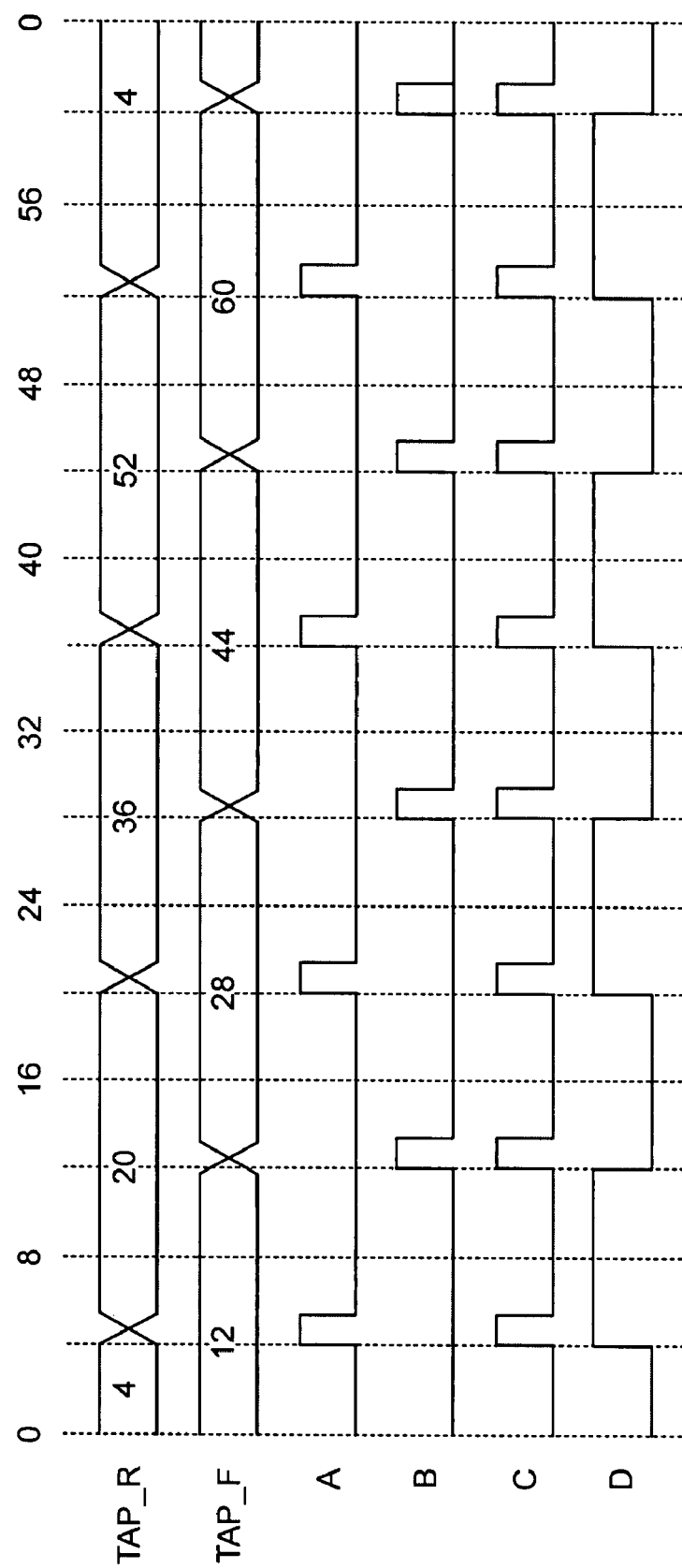
FIG. 9 is a waveform diagram illustrating waveforms at particular nodes of the circuit of FIG. 8 when a particular value of the "STEP" parameter is employed in that circuit.

FIG. 9 is a waveform diagram illustrating waveforms at the referenced nodes of the circuit of FIG. 8 when the "STEP" parameter is equal to "16." In the example circuit of FIG. 8 (in which the DLL 702 generates sixty-four evenly-spaced clock signals for each period of the reference clock), the output clock frequency is "64/STEP" times the reference clock frequency. Thus, the frequency of the synthesized clock in the example of FIG. 9 is four times that of the reference clock.

Figure 10:
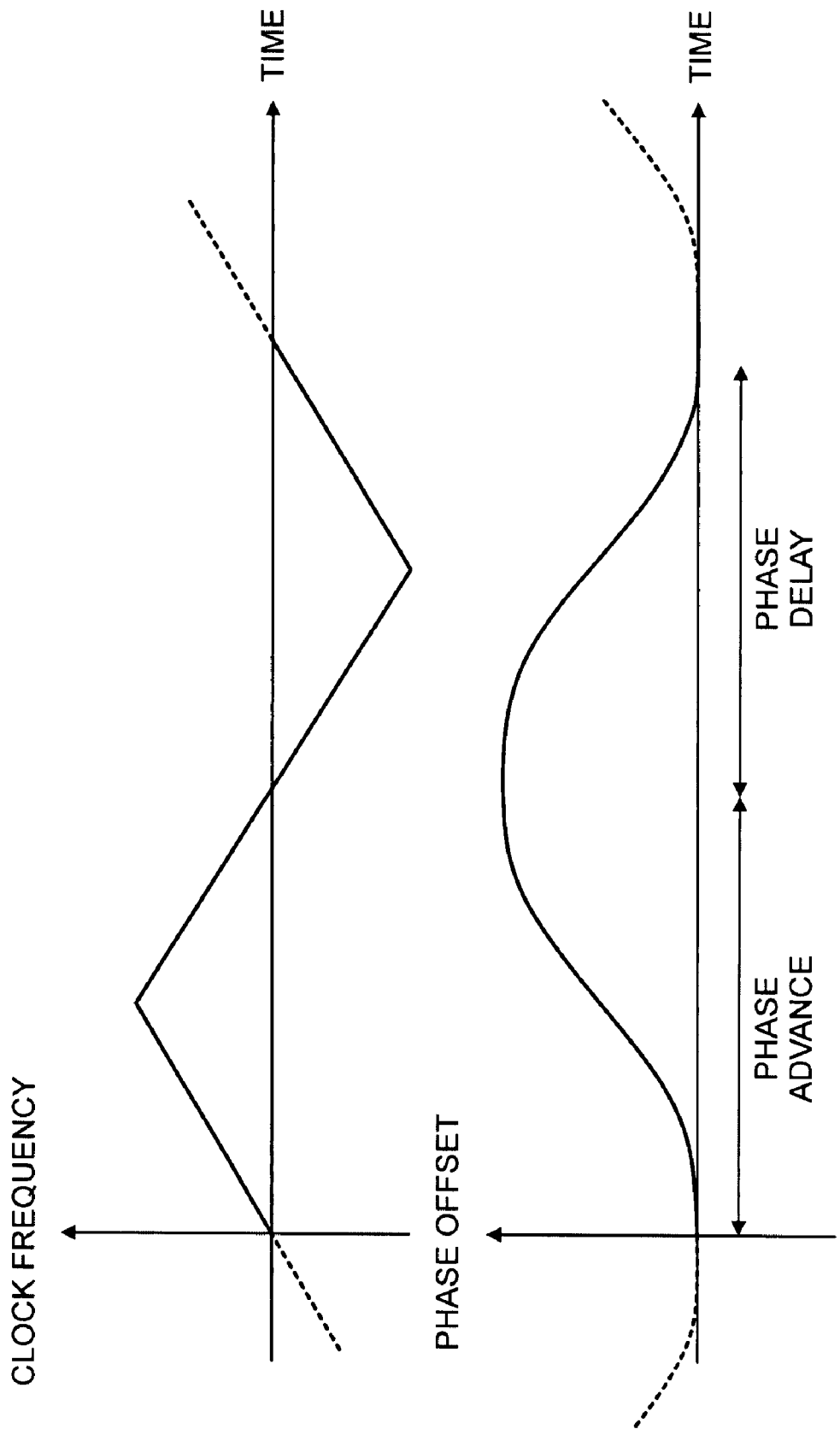
FIG. 10 comprises graphs illustrating how phase is the integral of frequency.
Figure 11:
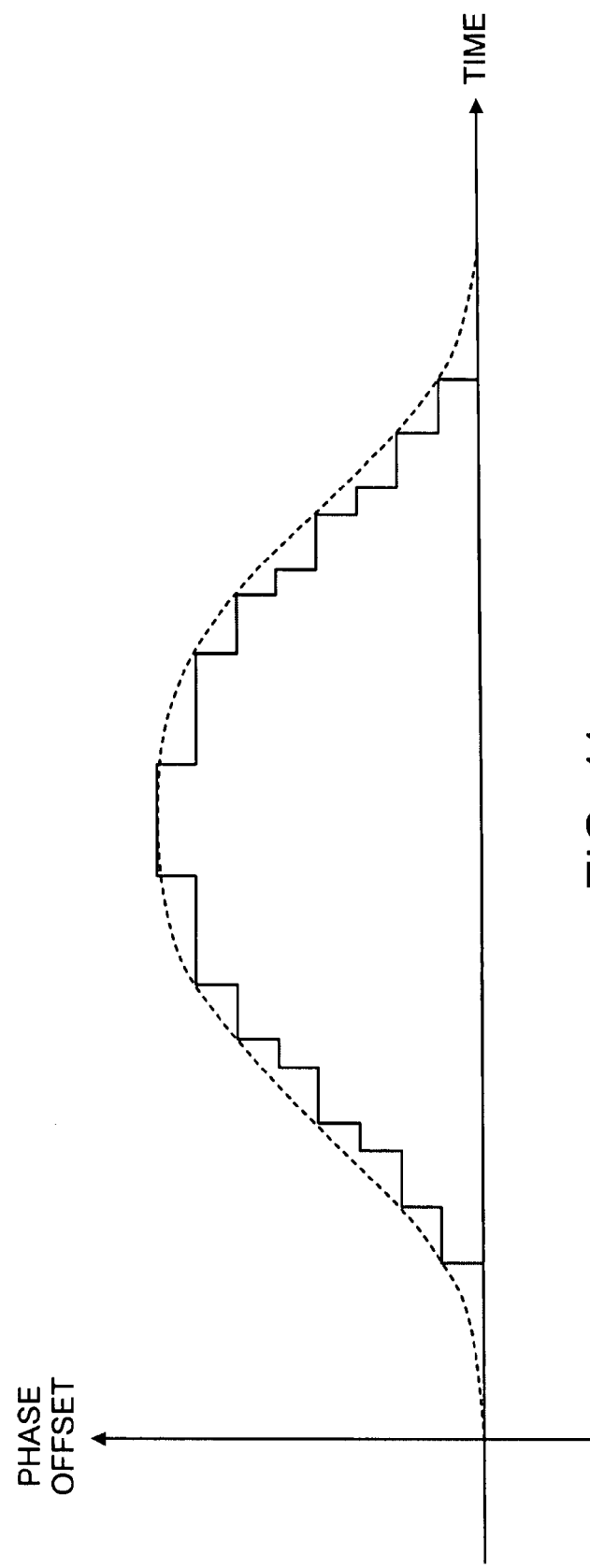
FIG. 11 is a graph illustrating how a phase waveform can be approximated by a discretized waveform in which phase changes only by integer multiples of some unit delay.

In addition to or in lieu of causing the generation of a synthesized clock with a frequency higher than the reference clock, the state machine circuit 708 of FIG. 7 can be configured so that the circuit 700 generates a digitally-controlled spread-spectrum clock signal. As shown in FIG. 10, frequency modulation is equivalent to phase modulation because phase (delay) is simply the integral of frequency. FIG. 11 shows how the ideal phase waveform can be approximated by a discretized waveform in which phase changes only by integer multiples of some unit delay.

Figure 12:
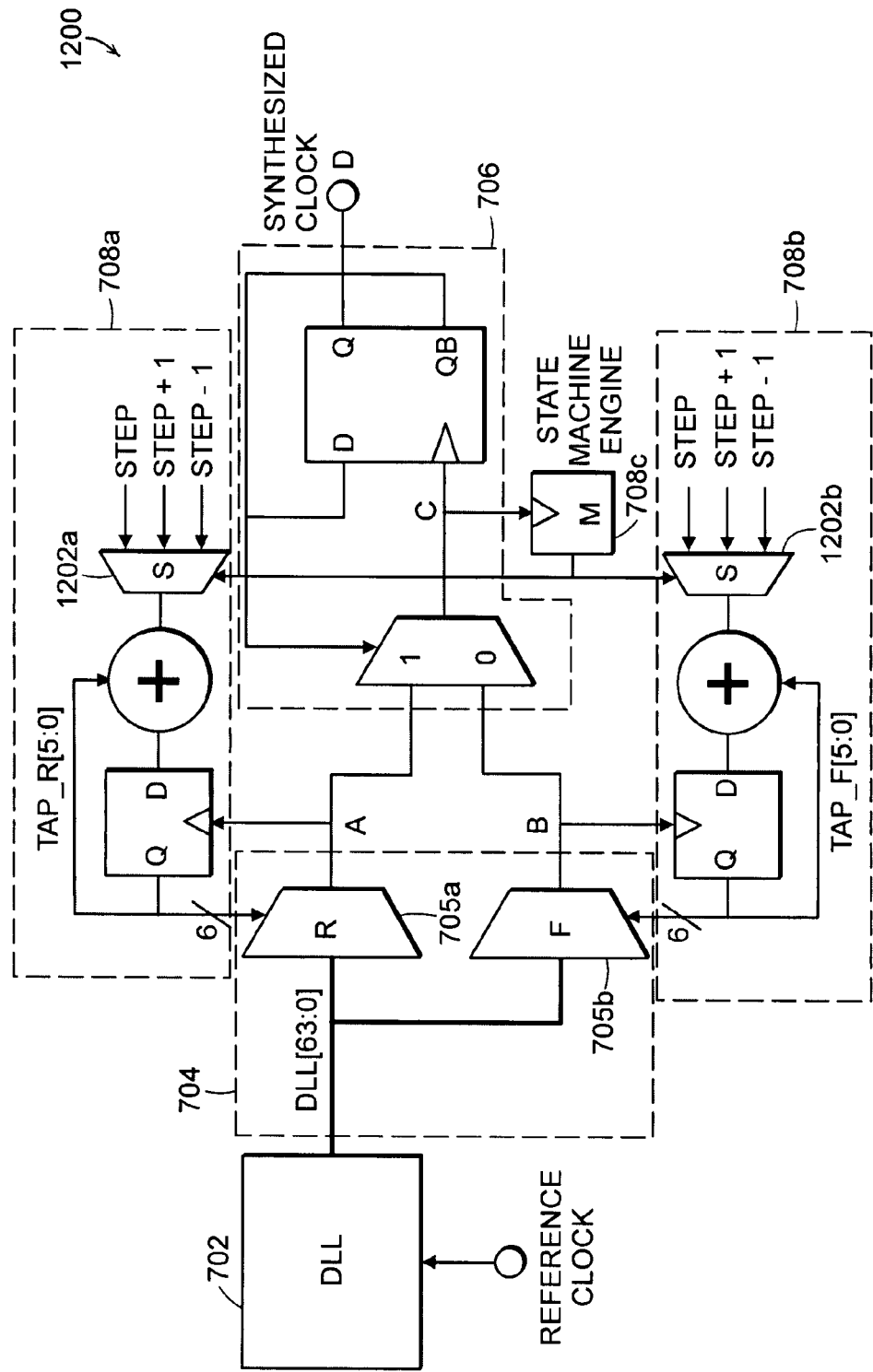
FIG. 12 is a block diagram of a spread-spectrum clock generator that embodies various aspects of the present invention.

An example of a circuit capable of implementing such a discretized phase delay, in addition to generating a synthesized clock with a frequency higher than the reference clock, is shown in FIG. 12. As shown, the embodiment of FIG. 12 is identical to that shown in FIG. 8, except for the presence of three additional components in the state machine circuit 708. In particular, the portions 708a and 708b of the state machine circuit 708 include additional 3-to-1 multiplexers 1202a and 1202b, respectively, and a state machine engine 708c is provided that generates and outputs control signals to the multiplexers 1202a, 1202b.

The state machine engine 708c may be clocked on each edge of the synthesized clock and may select the amount by which the multiplexer control signals TAP_R and TAP_F are incremented between adjacent rising/falling edges. The multiplexers 1202a, 1202b may, for example, be switched between "STEP" and "STEP+1" to increase delay, and between "STEP" and "STEP−1" to decrease delay. Because frequency modulation may be determined entirely by the pattern of delay increments and decrements, which may in turn be determined by the state machine engine 708c, the modulation parameters and shape can be digitally programmed. The state machine engine 708c can also be easily tested in production by standard digital test techniques such as scan chain. Stability over PVT is excellent since the only analog component is the delay line itself, and its overall delay is stabilized using feedback.

Figure 13:
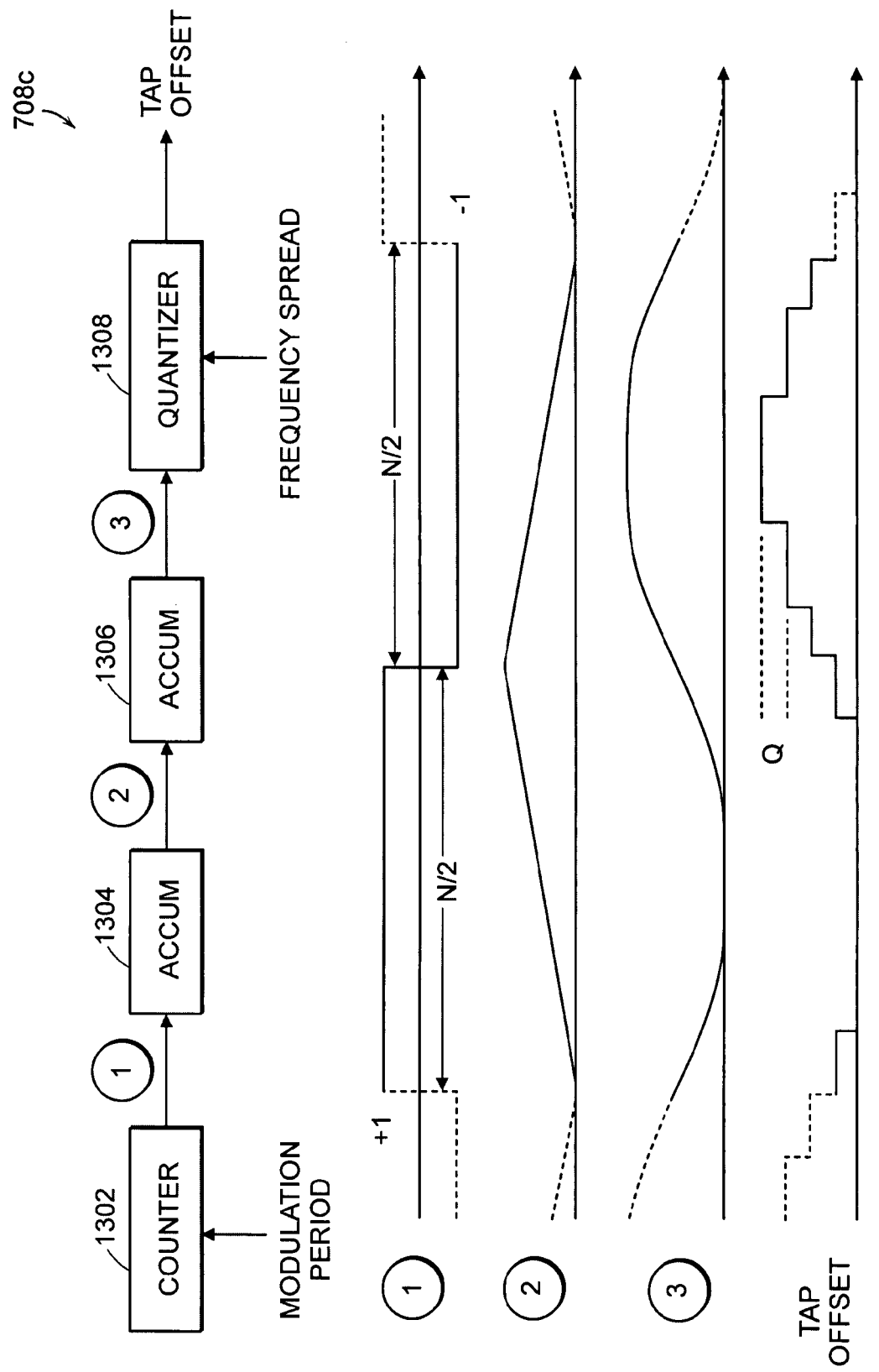
FIG. 13 is a block diagram and corresponding waveform diagram illustrating an example configuration, and resulting waveforms at particular nodes, of the state machine engine shown in FIG. 12.

FIG. 13 is a block diagram showing one possible implementation of the state machine engine 708c that can be used for triangle-wave modulation, along with a waveform diagram showing resulting waveforms that may appear at various nodes referenced in the diagram. As shown, a counter 1302 may generate an output of "+1" for "N/2" cycles, followed by an output of "−1" for "N/2" cycles, where "N" determines the modulation period. The counter output may then be integrated by a first accumulator 1304 to generate a triangle wave, and then by a second accumulator 1306 to generate the delay waveform. The delay waveform may then be quantized by "Q," where "Q" determines the frequency spread. In the final step (not shown), the state machine engine 708c may output a control signal to the multiplexers 1202a, 1202b to select "STEP," "STEP+1," or "STEP−1" when the quantized delay waveform has no change, a positive change, or a negative change, respectively, between adjacent clock cycles.

Figure 14:
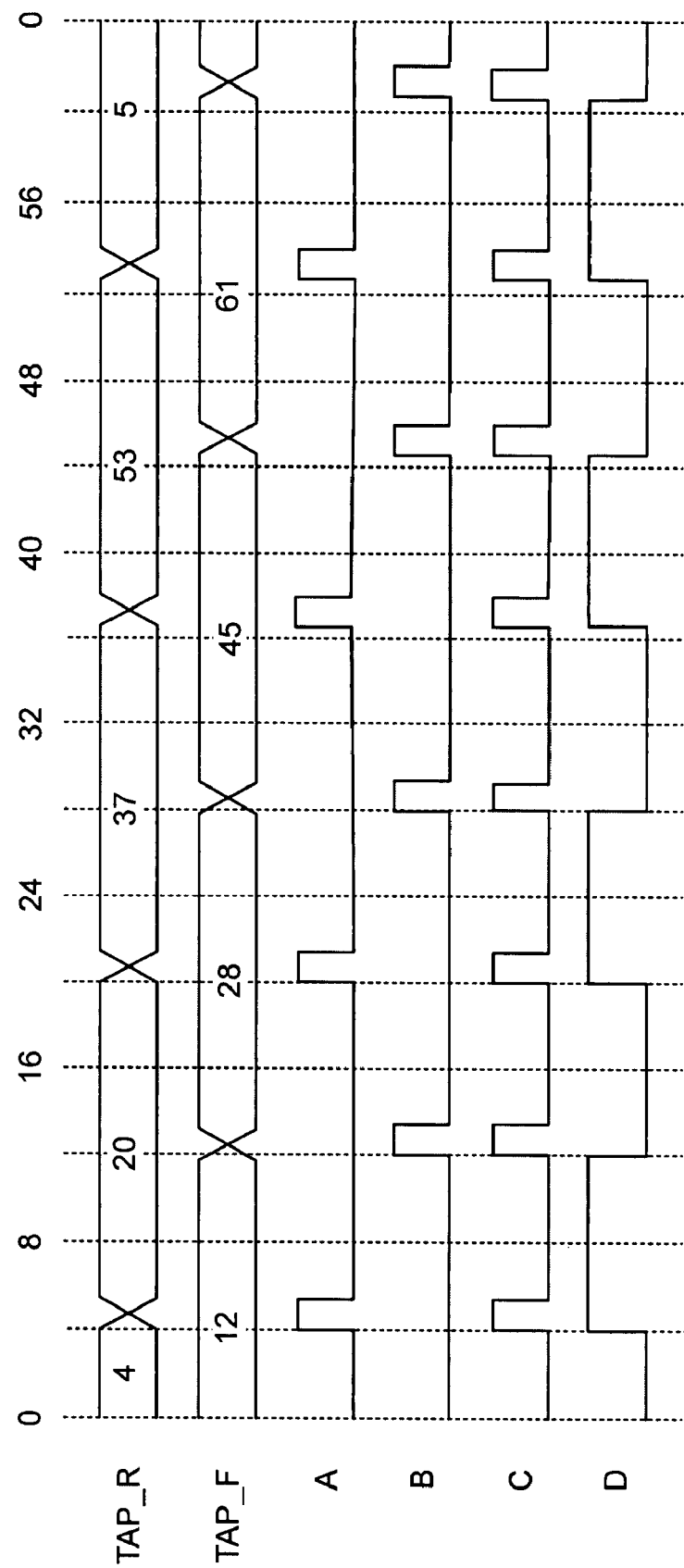
FIG. 14 is a waveform diagram illustrating waveforms at particular nodes of the spread spectrum clock generator of FIG. 12 when a particular value of the "STEP" parameter is employed in that circuit.

FIG. 14 is a waveform diagram illustrating how waveforms at the referenced nodes of the circuit of FIG. 12 may appear when the "STEP" parameter is set at "16."

In some embodiments, the quantized delay waveform can be generated so that the clock frequency waveform approximates those disclosed in U.S. Pat. No. 5,488,627, which is incorporated herein by reference in its entirety.

Although the use of two separate multiplexers 705a, 705b in the multiplexing circuit 704 provides certain advantages in terms of the synthesized clock speeds that can be achieved, a single multiplexer could alternatively be used in alternative embodiments. In such embodiments, the state machine circuit 708 could, for example, be programmed to select respective ones of the clock signals from the DLL 702 at appropriate times (e.g., one that will determine the rise time of the synthesized signal, a next one that will determine the fall time of the synthesized clock signal, and so on), and a single toggle-type flip-flop could be used in lieu of a clock synthesizing circuit that responds to two separately-selected clock inputs like those disclosed in the '311 patent.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method, comprising steps of:
   (a) receiving a plurality of clock signals;
   (b) providing selected ones of the plurality of clock signals to a clock synthesizing circuit;
   (c) using the clock synthesizing circuit to generate a synthesized clock signal having transitions determined by transitions of the selected ones of the plurality of clock signals;
   (d) generating a first waveform representing a frequency spread pattern for a modulation period;
   (e) integrating the first waveform to generate a second waveform representing a phase change pattern for the modulation period; and
   (f) selecting the ones of the plurality of clock signals that are provided to the clock synthesizing circuit based upon the second waveform such that the synthesized clock signal comprises a spread spectrum signal reflecting the phase change pattern for the modulation period.

2. The method of claim 1, wherein the plurality of clock signals comprises at least three clock signals that are respective, different delayed versions of a reference clock signal.

3. The method of claim 1, wherein:
   the step (c) comprises steps of (c1) each time the synthesized clock signal is in a first state, changing the synthesized clock signal from the first state to a second state in response to detecting a state change in a first selected one of the plurality of clock signals, and (c2) each time the synthesized clock signal is in the second state, changing the synthesized clock signal from the second state to the first state in response to detecting a state change in a second selected one of the plurality of clock signals; and
   the step (f) comprises controlling the selection of the first and second selected ones of the plurality of clock signals based upon the second waveform such that the synthesized clock signal comprises a spread spectrum signal reflecting the phase change pattern for the modulation period.

4. The method of claim 3, wherein:
   the step (a) comprises receiving the plurality of clock signals at inputs of each of first and second multiplexers having outputs coupled to the clock synthesizing circuit to provide the first and second selected ones of the plurality of clock signals thereto; and
   the step (f) comprises controlling the first and second multiplexers to output the first and second selected ones of the plurality of clock signals based upon the second waveform such that the synthesized clock signal comprises a spread spectrum signal reflecting the phase change pattern for the modulation period.

5. The method of claim 1, wherein each of the plurality of clock signals oscillates at a nominal frequency that is less than a particular value, and the step (f) further comprises selecting the ones of the plurality of clock signals that are provided to the clock synthesizing circuit so that the clock synthesizing circuit causes the synthesized clock signal to oscillate at a nominal frequency that is greater than the particular value.

6. The method of claim 1, wherein:
   the method further comprises a step of receiving a first input value representing a duration of the modulation period at a first time; and
   the step (d) comprises generating the first waveform based upon the first input value at the first time.

7. The method of claim 6, wherein:
   the method further comprises a step of receiving a second input value, which is different than the first input value, representing a duration of the modulation period at a second time; and
   the step (d) comprises generating the first waveform based upon the second input value at the second time.

8. The method of claim 1, wherein:
   the method further comprises a step of (g) quantizing the second waveform based upon a frequency spread value so as to generate a third waveform that represents phase changes of only integer multiples of a particular time period; and
   the step (f) comprises selecting at least one different one of the plurality of clock signals to be provided to the clock synthesizing circuit in response to each change in the third waveform.

9. The method of claim 8, wherein:
   the method further comprises a step of receiving a first input value representing the frequency spread value at a first time; and
   the step (g) further comprises generating the third waveform based upon the first input value at the first time.

10. The method of claim 9, wherein:
    the method further comprises a step of receiving a second input value, which is different than the first input value, representing the frequency spread value at a second time; and
    the step (g) further comprises generating the third waveform based upon the second input value at the second time.

11. The method of claim 9, wherein:
    the method further comprises a step of receiving a second input value representing a duration of the modulation period at the first time; and
    the step (d) comprises generating the first waveform based upon the second input value at the first time.

12. The method of claim 11, wherein:
    the method further comprises a step of receiving a third input value, which is different than the first input value, representing the frequency spread value at a second time;
    the step (g) further comprises generating the third waveform based upon the third input value at the second time;
    the method further comprises a step of receiving a fourth input value, which is different than the second input value, representing a duration of the modulation period at the second time; and
    the step (d) comprises generating the first waveform based upon the fourth input value at the second time.

13. The method of claim 1, wherein the step (d) comprises accumulating a value of a counter output that has a positive value for N/2 clock cycles and has a negative value for the following N/2 cycles so as to generate the first waveform over a modulation period of N clock cycles.

14. An apparatus, comprising:
    a clock generating circuit configured to generate at least three clock signals;
    a multiplexing circuit comprising at least three clock inputs coupled to the clock generating circuit to receive the at least three clock signals therefrom, at least one control input, and at least one output, the multiplexing circuit being configured to select particular ones of the at least three clock signals to be provided at the at least one output based upon at least one control signal received at the at least one control input;

a clock synthesizing circuit coupled to the at least one output of the multiplexing circuit to receive the selected ones of the at least three clock signals therefrom, the clock synthesizing circuit being configured to output a synthesized clock signal having transitions determined by transitions of the selected ones of the at least three clock signals; and a state machine circuit coupled to the multiplexing circuit to provide the at least one control signal thereto, the state machine circuit being configured to repeatedly cycle through at least three different states of the at least one control signal, in response to transitions of at least one clock signal, so as to cause the multiplexing circuit to provide at least three different ones of the at least three clock signals to the at least one output during each cycle of the state machine, the state machine circuit being further configured (1) to generate a first waveform representing a frequency spread pattern for a modulation period comprising a plurality of the transitions of at least one clock signal, (2) to generate a second waveform representing a phase change pattern for the modulation period by integrating the first waveform, and (3) to change states of the at least one control signal based upon the second waveform such that the synthesized clock signal comprises a spread spectrum signal reflecting the phase change pattern for the modulation period.

15. The apparatus of claim 14, wherein the clock generating circuit is configured to generate the at least three clock signals such that the at least three clock signals comprise at least three respective, different delayed versions of a reference clock signal.

16. The apparatus of claim 14, wherein the clock synthesizing circuit is configured such that each time the synthesized clock signal is in a first state, the synthesized clock signal is changed from the first state to a second state in response to detecting a state change in a first selected one of the at least three clock signals, and such that each time the synthesized clock signal is in the second state, the synthesized clock signal is changed from the second state to the first state in response to detecting a state change in a second selected one of the at least three clock signals.

17. The apparatus of claim 16, wherein:

the multiplexing circuit comprises first and second multiplexers each having at least three inputs coupled to the clock generating circuit to receive the at least three clock signals therefrom, the first multiplexer having a first output coupled to the clock synthesizing circuit to provide the first selected one of the at least three clock signals thereto and the second multiplexer having a second output coupled to the clock synthesizing circuit to provide the second selected one of the at least three clock signals thereto; and the state machine circuit is configured to provide at least one first control signal to the first multiplexer that selects the one of the at least three clock signals that is provided at the first output and to provide at least one second control signal to the second multiplexer that selects the one of the at least three clock signals that is provided at the second output.

18. The apparatus of claim 17, wherein the state machine circuit is configured to change a state of the at least one first control signal in response to detecting the state change in the first selected one of the at least three clock signals, and to change a state of the at least one second control signal in response to detecting the state change in the second selected one of the at least three clock signals.

19. The apparatus of claim 14, wherein the clock generating circuit is configured to generate the at least three clock signals so that each of the at least three clock signals oscillates at a nominal frequency that is less than a particular value, and the state machine circuit is configured to alter the state of the at least one control signal so that the clock synthesizing circuit generates a synthesized clock signal that oscillates at a nominal frequency that is greater than the particular value.

20. The apparatus of claim 14, wherein the state machine circuit is further configured to receive a variable input representing a duration of the modulation period and to generate the first waveform based thereupon.

21. The apparatus of claim 14, wherein the state machine circuit is further configured to quantize the second waveform based upon a frequency spread value so as to generate a third waveform that represents phase changes of only integer multiples of a particular time period, and to change states of the at least one control signal in response to changes in the third waveform.

22. The apparatus of claim 21, wherein the state machine circuit is further configured to receive a variable input representing the frequency spread value and to generate the third waveform based thereupon.

23. The apparatus of claim 14, wherein the state machine circuit comprises a counter configured to produce a positive output value for N/2 clock cycles and a negative output value for the following N/2 cycles, and an accumulator configured to accumulate the counter output values so as to generate the first waveform over a modulation period of N clock cycles.

24. A method, comprising steps of:
(a) receiving a plurality of clock signals;
(b) providing selected ones of the plurality of clock signals to a clock synthesizing circuit;
(c) using the clock synthesizing circuit to generate a synthesized clock signal having transitions determined by transitions of the selected ones of the plurality of clock signals;
(d) receiving a first input value at a first time; and
(e) controlling selection of the ones of the plurality of clock signals that are provided to the clock synthesizing circuit at the first time so that the clock synthesizing circuit generates the synthesized clock signal as a spread spectrum clock signal that is spread over a range of frequencies during each of a first plurality of modulation periods, a duration of each of the first plurality of modulation periods being determined by the first input value.

25. The method of claim 24, further comprising steps of:
(f) receiving a second input value, which is different than the first input value, at a second time; and
(g) controlling selection of the ones of the plurality of clock signals that are provided to the clock synthesizing circuit at the second time so that the clock synthesizing circuit generates the synthesized clock signal as a spread spectrum clock signal that is spread over a range of frequencies during each of a second plurality of modulation periods, a duration of each of the second plurality of modulation periods being determined by the second input value.

26. The method of claim 24, further comprising steps of:
(f) receiving a second input value at the first time; and
(g) controlling selection of the ones of the plurality of clock signals that are provided to the clock synthesizing circuit at the first time so that the clock synthesizing circuit generates the synthesized clock signal as a spread spectrum clock signal that is spread over a first range of frequencies during each of the first plurality of modulation periods, an extent of the first range of frequencies being determined by the second input value.

27. The method of claim 26, further comprising steps of:
(h) receiving a third input value, which is different than the first input value, at a second time; and
(i) controlling selection of the ones of the plurality of clock signals that are provided to the clock synthesizing circuit at the second time so that the clock synthesizing circuit generates the synthesized clock signal as a spread spectrum clock signal that is spread over a range of frequencies during each of a second plurality of modulation periods, a duration of each of the second plurality of modulation periods being determined by the third input value.

28. The method of claim 27, further comprising steps of:
(j) receiving a fourth input value, which is different than the second input value, at the second time; and
(k) controlling selection of the ones of the plurality of clock signals that are provided to the clock synthesizing circuit at the second time so that the clock synthesizing circuit generates the synthesized clock signal as a spread spectrum clock signal that is spread over a second range of frequencies during each of the second plurality of modulation periods, an extent of the second range of frequencies being determined by the fourth input value.

29. The method of claim 26, further comprising steps of:
(h) receiving a third input value, which is different than the second input value, at a second time; and
(i) controlling selection of the ones of the plurality of clock signals that are provided to the clock synthesizing circuit at the second time so that the clock synthesizing circuit generates the synthesized clock signal as a spread spectrum clock signal that is spread over a second range of frequencies during each of a second plurality of modulation periods, an extent of the second range of frequencies being determined by the third input value.

30. A method, comprising steps of:
(a) receiving a plurality of clock signals;
(b) providing selected ones of the plurality of clock signals to a clock synthesizing circuit;
(c) using the clock synthesizing circuit to generate a synthesized clock signal having transitions determined by transitions of the selected ones of the plurality of clock signals;
(d) receiving a first input value at a first time; and
(e) controlling selection of the ones of the plurality of clock signals that are provided to the clock synthesizing circuit at the first time so that the clock synthesizing circuit generates the synthesized clock signal as a spread spectrum clock signal that is spread over a first range of frequencies during each of a first plurality of modulation periods, an extent of the first range of frequencies being determined by the first input value.

31. The method of claim 30, further comprising steps of:
(f) receiving a second input value, which is different than the first input value, at a second time; and
(g) controlling selection of the ones of the plurality of clock signals that are provided to the clock synthesizing circuit at the second time so that the clock synthesizing circuit generates the synthesized clock signal as a spread spectrum clock signal that is spread over a second range of frequencies during each of a second plurality of modulation periods, an extent of the second range of frequencies being determined by the second input value.

* * * * *